United States Patent
Swarbrick et al.

(10) Patent No.: US 10,824,505 B1
(45) Date of Patent: Nov. 3, 2020

(54) ECC PROXY EXTENSION AND BYTE ORGANIZATION FOR MULTI-MASTER SYSTEMS

(71) Applicant: Xilinx, Inc., San Jose, CA (US)

(72) Inventors: Ian A. Swarbrick, Santa Clara, CA (US); Nishit Patel, San Jose, CA (US)

(73) Assignee: XILINX, INC., San Jose, CA (US)

( * ) Notice: Subject to any disclaimer, the term of this patent is extended or adjusted under 35 U.S.C. 154(b) by 57 days.

(21) Appl. No.: 16/106,691

(22) Filed: Aug. 21, 2018

(51) Int. Cl.
G06F 11/10 (2006.01)
G06F 13/40 (2006.01)
G06F 13/16 (2006.01)
G11C 29/52 (2006.01)

(52) U.S. Cl.
CPC ...... *G06F 11/1068* (2013.01); *G06F 13/1668* (2013.01); *G06F 13/4027* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 6,781,407 B2 | 8/2004 | Schultz | |
| 7,199,608 B1 | 4/2007 | Trimberger | |
| 7,301,822 B1 | 11/2007 | Walstrum, Jr. et al. | |
| 7,328,335 B1 | 2/2008 | Sundararajan et al. | |
| 7,420,392 B2 | 9/2008 | Schultz et al. | |
| 7,576,561 B1 | 8/2009 | Huang | |
| 7,620,875 B1 * | 11/2009 | Nelson | G06F 11/1044 714/763 |
| 7,653,820 B1 | 1/2010 | Trimberger | |
| 7,689,726 B1 | 3/2010 | Sundararajan et al. | |
| 8,341,503 B1 * | 12/2012 | Yoon | G06F 11/1048 711/173 |
| 9,152,794 B1 | 10/2015 | Sanders et al. | |
| 9,165,143 B1 | 10/2015 | Sanders et al. | |
| 9,230,112 B1 | 1/2016 | Peterson et al. | |
| 9,323,876 B1 | 4/2016 | Lysaght et al. | |
| 9,336,010 B2 | 5/2016 | Kochar | |
| 9,411,688 B1 | 8/2016 | Poolla et al. | |
| 9,632,869 B1 * | 4/2017 | Lu | G11C 29/52 |
| 9,652,252 B1 | 5/2017 | Kochar et al. | |
| 9,652,410 B1 | 5/2017 | Schelle et al. | |

(Continued)

OTHER PUBLICATIONS

U.S. Appl. No. 15/936,916, filed Mar. 27, 2018, Swarbrick, I.A., et al., San Jose, CA USA.

(Continued)

*Primary Examiner* — Steve N Nguyen
(74) *Attorney, Agent, or Firm* — Patterson + Sheridan, LLP

(57) ABSTRACT

An example multi-master system in a system-on-chip (SoC) includes a plurality of master circuits, an error-correcting code (ECC) proxy bridge comprising hardened circuitry in the SoC, a local interconnect configured to couple the plurality of master circuits to the ECC proxy bridge, a memory not having ECC support, and a system interconnect configured to couple the ECC proxy bridge to the memory. The ECC proxy bridge is configured to establish an ECC proxy region in the memory and, for each write transaction from the plurality of master circuits that targets the ECC proxy region, calculate and insert ECC bytes into the respective write transaction.

18 Claims, 11 Drawing Sheets

(56) References Cited

U.S. PATENT DOCUMENTS

| | | |
|---|---|---|
| 2004/0114609 A1 | 6/2004 | Swarbrick et al. |
| 2004/0210695 A1 | 10/2004 | Weber et al. |
| 2008/0320255 A1 | 12/2008 | Wingard et al. |
| 2008/0320268 A1 | 12/2008 | Wingard et al. |
| 2012/0036296 A1 | 2/2012 | Wingard et al. |
| 2017/0140800 A1 | 5/2017 | Wingard et al. |
| 2018/0032394 A1* | 2/2018 | Quach .................... G06F 3/064 |

OTHER PUBLICATIONS

U.S. Appl. No. 15/588,321, filed May 5, 2017, Camarota, R., et al., San Jose, CA USA.
U.S. Appl. No. 16/041,473, filed Jul. 20, 2018, Swarbrick, Ian A., et al., San Jose, CA USA.
U.S. Appl. No. 15/990,506, filed May 25, 2018, Swarbrick, Ian A., et al., San Jose, CA USA.
U.S. Appl. No. 15/964,901, filed Apr. 27, 2018, Swarbrick, Ian A., San Jose, CA USA.
Xilinx, Inc., "Zynq-7000 AP SoC—32 Bit DDR Access with ECC Tech Tip", 15 pages, printed on Aug. 10, 2018, http://www.wiki.xilinx.com/Zynq-7000+APF+SoC+-+32+Bit+DDR+Access+with+ECC—Tech+Tip, San Jose, CA USA.

\* cited by examiner

▦ NMU
▨ NSU
⊠ NPS
▥ NPI

ECC PROXY EXTENSION AND BYTE ORGANIZATION FOR MULTI-MASTER SYSTEMS

TECHNICAL FIELD

Examples of the present disclosure generally relate to electronic circuits and, in particular, to error correction code (ECC) proxy extension and byte organization for multi-master systems.

BACKGROUND

Advances in integrated circuit technology have made it possible to embed an entire system, such as including a processor core, a memory controller, and a bus, in a single semiconductor chip. This type of chip is commonly referred to as a system-on-chip (SoC). Other SoCs can have different components embedded therein for different applications. The SoC provides many advantages over traditional processor-based designs. It is an attractive alternative to multi-chip designs because the integration of components into a single device increases overall speed while decreasing size. The SoC is also an attractive alternative to fully customized chips, such as an application specific integrated circuit (ASIC), because ASIC designs tend to have a significantly longer development time and larger development costs. A configurable SoC (CSoC), which includes programmable logic, has been developed to implement a programmable semiconductor chip that can obtain benefits of both programmable logic and SoC.

Error-correcting code (ECC) memory can detect and correct common types of internal data corruption. Typically, ECC memory is immune to single-bit errors or double-bit errors when using single error correct, double error detect (SECDED). Data words read from memory locations are the same as the data words written to the memory locations, even if one or more bits actually stored have been flipped to the incorrect stage. Some types of double-data rate (DDR) memory devices do not support ECC due to architecture and/or cost constraints (e.g., ECC requires additional integrated circuits (ICs) and real estate on the memory module). However, it is still desirable to achieve error correction functionality when using these non-ECC memory devices.

SUMMARY

Techniques for error correction code (ECC) proxy extension and byte organization for multi-master systems are described. In an example, a multi-master system in a system-on-chip (SoC) includes: a plurality of master circuits; an error-correcting code (ECC) proxy bridge comprising hardened circuitry in the SoC; a local interconnect configured to couple the plurality of master circuits to the ECC proxy bridge; a memory not having ECC support; and a system interconnect configured to couple the ECC proxy bridge to the memory; wherein the ECC proxy bridge is configured to establish an ECC proxy region in the memory and, for each write transaction from the plurality of master circuits that targets the ECC proxy region, calculate and insert ECC bytes into the respective write transaction.

In another example, a programmable integrated circuit (IC) includes: a processing system; programmable logic; a plurality of master circuits disposed in the processing system, the programmable logic, or both the processing system and the programmable logic; an error-correcting code (ECC) proxy bridge comprising hardened circuitry in the programmable IC; a local interconnect configured to couple the plurality of master circuits to the ECC proxy bridge; a memory controller configured to interface with a memory that does not have ECC support; a system interconnect configured to couple the ECC proxy bridge to the memory controller; wherein the ECC proxy bridge is configured to establish an ECC proxy region in the memory and, for each write transaction from the plurality of master circuits that targets the ECC proxy region, calculate and insert ECC bytes into the respective write transaction.

In another example, a method of communication between a plurality of master circuits and a memory in a system-on-chip (SoC) includes: establishing, by an error-correcting code (ECC) proxy bridge comprising hardened circuitry in the SoC, an ECC proxy region in a memory; receiving write transactions from a plurality of master circuits for the memory, the write transactions targeting the ECC proxy region in the memory; calculating, for each write transaction, ECC bytes for bytes of the respective write transaction at the ECC proxy bridge; inserting, by the ECC proxy bridge, the ECC bytes into the respective write transactions; and forwarding the write transactions from the ECC proxy bridge to the memory.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
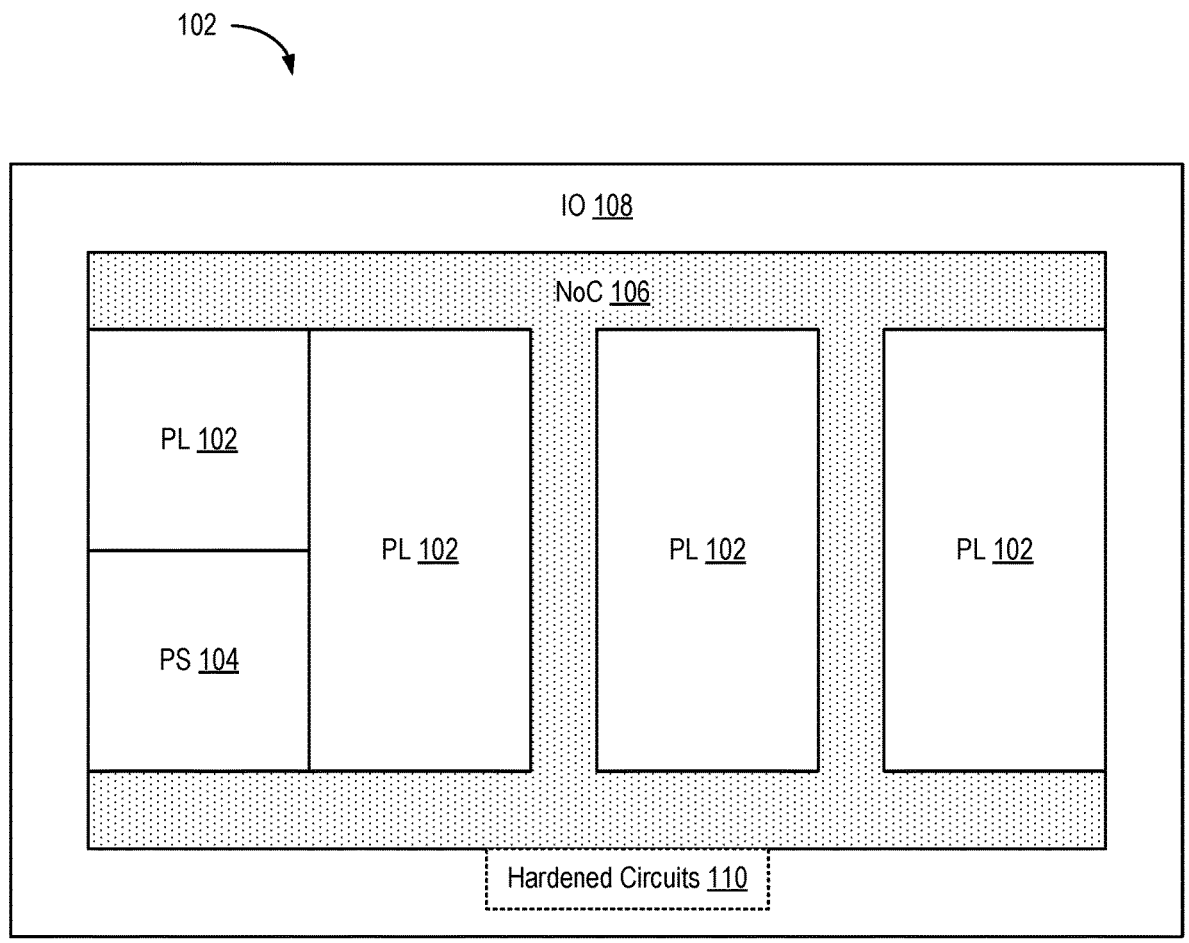
FIG. 1 is a block diagram depicting a system-on-chip (SoC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting a system-on-chip (SoC) 102 according to an example. The SoC 100 is an integrated circuit (IC) that includes a plurality of regions having circuitry with different functionalities. In the example, the SoC 100 includes programmable logic (PL) regions 102, a processing system (PS) 104, a network-on-chip (NoC) 106, and input/output (IO) region 108. In some examples, the SoC 100 includes hardened circuits 110, such as memory controllers, math engines, or the like. The programmable logic region(s) 102 can include any number of configurable logic blocks (CLBs), which may be programmed or configured to form specific circuitry. The PS 104 can include one or more processor cores and associated support circuitry. For example, the processing system can include a number of ARM-based embedded processor cores. The NoC 106 includes an interconnecting network for sharing data between endpoint circuits in the SoC 100. The endpoint circuits can be disposed in the PL regions 102, the PS 104, the hardened circuits 110, and/or the 10 region 108. The NoC 106 can include high-speed data paths with dedicated switching. In an example, the NoC 106 includes horizontal paths, vertical paths, or both horizontal and vertical paths. The 10 region 108 can include input/output blocks (IOBs) and the like for transmitting and receiving signals external to the SoC 100. The arrangement and number of regions shown in FIG. 1 is merely an example. In general, the SoC 100 includes one or more PL regions 102, a PS 104, and a NoC 106.

Figure 2:
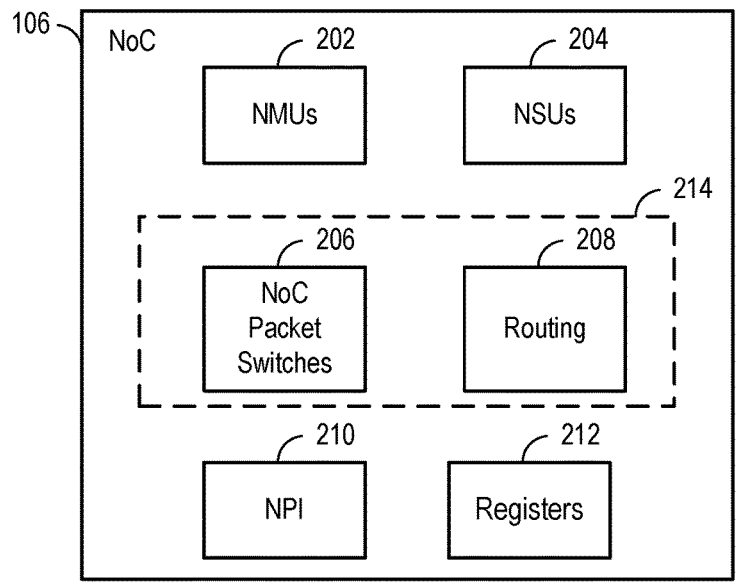
FIG. 2 is a block diagram depicting a network on chip (NoC) according to an example.

FIG. 2 is a block diagram depicting the NoC 106 according to an example. The NoC 106 includes NoC master units (NMUs) 202, NoC slave units (NSUs) 204, a network 214, NoC peripheral interconnect (NPI) 210, and registers 212. Each NMU 202 is an ingress circuit that connects an endpoint circuit to the NoC 106. Each NSU 204 is an egress circuit that connects the NoC 106 to an endpoint circuit. The NMUs 202 are connected to the NSUs 204 through the network 214. In an example, the network 214 includes NoC packet switches 206 ("NPSs") and routing 208 between the NoC packet switches 206. Each NoC packet switch 206 performs switching of NoC packets. The NoC packet switches 206 are connected to each other and to the NMUs 202 and NSUs 204 through the routing 208 to implement a plurality of physical channels. The NoC packet switches 206 also support multiple virtual channels per physical channel. The NPI 210 includes circuitry to program the NMUs 202, NSUs 204, and NoC packet switches 206. For example, the NMUs 202, NSUs 204, and NoC packet switches 206 can include registers 212 that determine functionality thereof. The NPI 210 includes a peripheral interconnect coupled to the registers 212 for programming thereof to set functionality. The registers 212 in the NoC 106 support interrupts, QoS, error handling and reporting, transaction control, power management, and address mapping control. The registers 212 can be initialized in a usable state before being reprogrammed, such as by writing to the registers 212 using write requests. Configuration data for the NoC 106 can be stored in a non-volatile memory (NVM) and provided to the NPI 210 for programming the NoC 106 and/or other endpoint circuits.

The NMUs 202 are traffic ingress points. The NSUs 204 are traffic egress points. Endpoint circuits coupled to the NMUs 202 and NSUs 204 can be hardened circuits (e.g., hardened circuits 110) or circuits configured in programmable logic. A given endpoint circuit can be coupled to more than one NMU 202 or more than one NSU 204.

Figure 3:
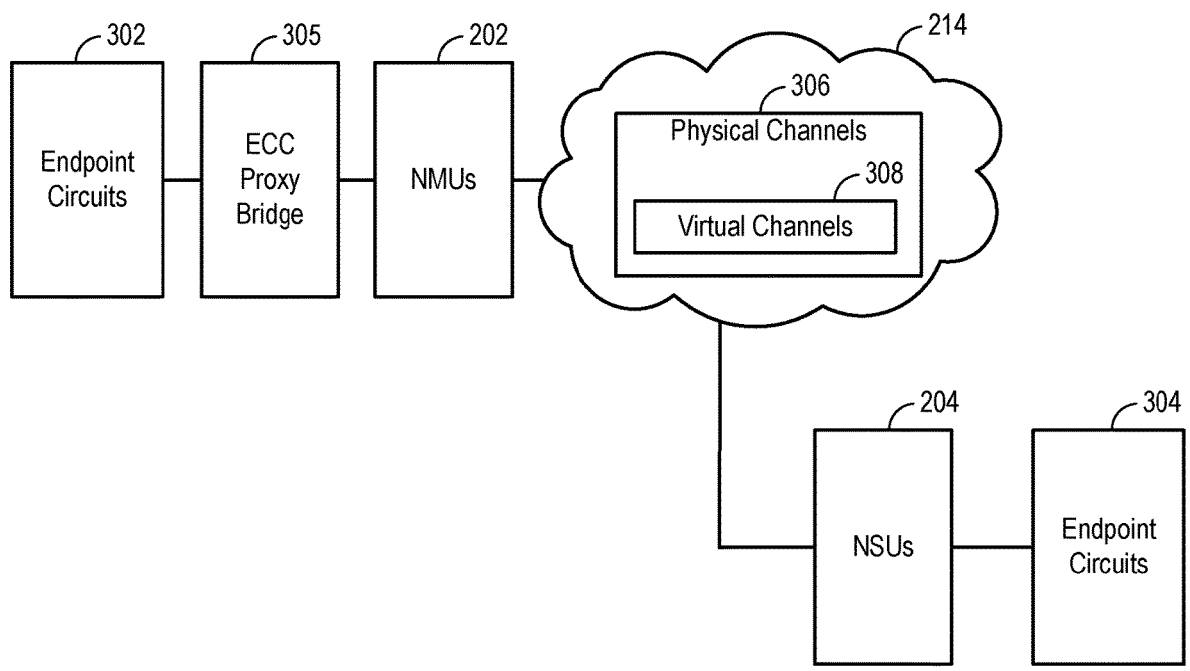
FIG. 3 is a block diagram depicting connections between endpoint circuits in an SoC through a NoC according to an example.

FIG. 3 is a block diagram depicting connections between endpoint circuits in an SoC through the NoC 106 according to an example. In the example, endpoint circuits 302 are connected to endpoint circuits 304 through the NoC 106. The endpoint circuits 302 are master circuits, which are coupled to NMUs 202 of the NoC 106. The endpoint circuits 304 are slave circuits coupled to the NSUs 204 of the NoC 106. Each endpoint circuit 302 and 304 can be a circuit in the processing system 104, a circuit in a programmable logic region 102, or a circuit in another subsystem (e.g., hardened circuits 110). Each endpoint circuit in the programmable logic region 102 can be a dedicated circuit (e.g., a hardened circuit) or a circuit configured in programmable logic.

The network 214 includes a plurality of physical channels 306. The physical channels 306 are implemented by programming the NoC 106. Each physical channel 306 includes one or more NoC packet switches 206 and associated routing 208. An NMU 202 connects with an NSU 204 through at least one physical channel 306. A physical channel 306 can also have one or more virtual channels 308.

Connections through the network 214 use a master-slave arrangement. In an example, the most basic connection over the network 214 includes a single master connected to a single slave. However, in other examples, more complex structures can be implemented.

Figure 4:
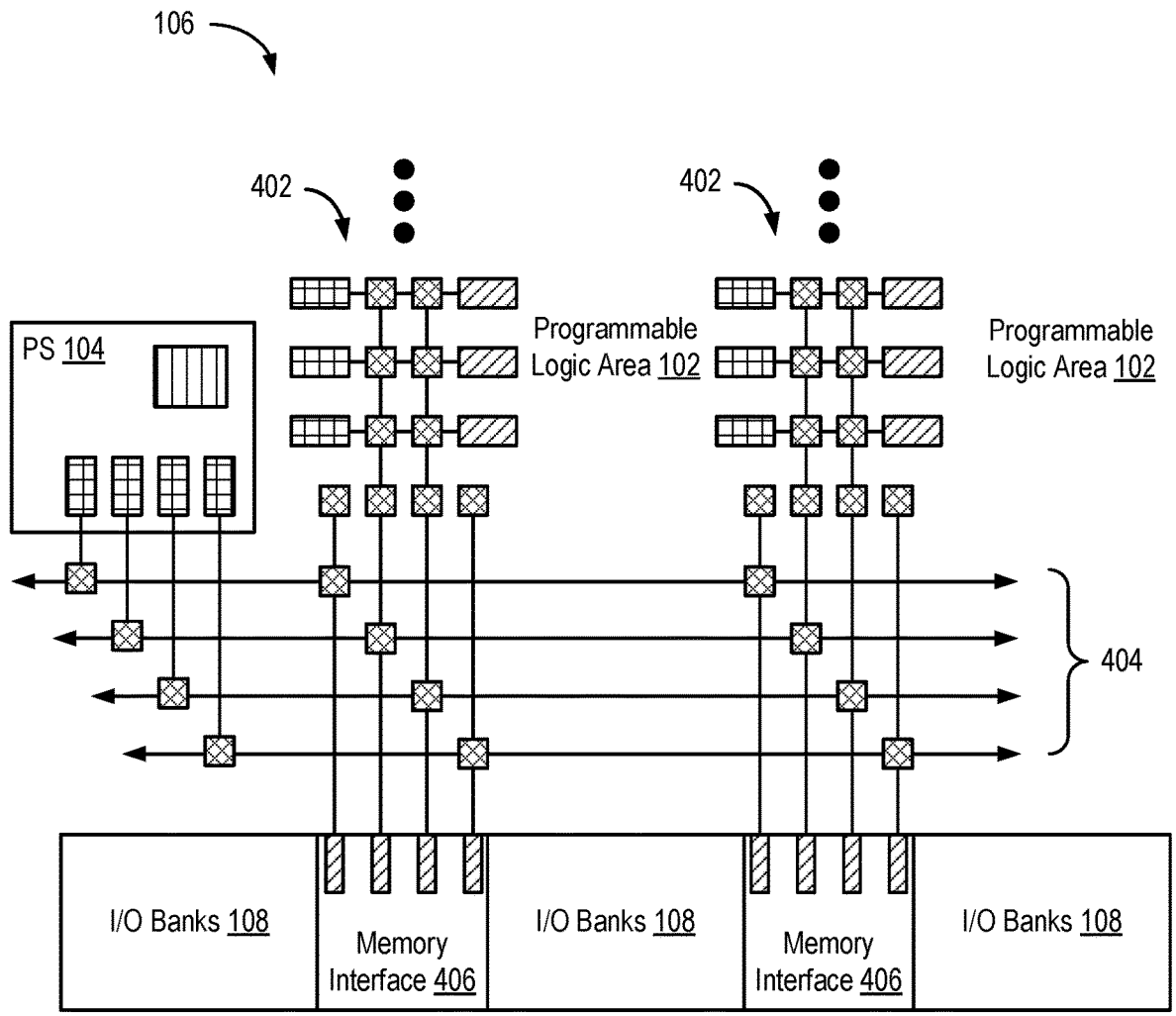
FIG. 4 is a block diagram depicting a NoC according to another example.

FIG. 4 is a block diagram depicting the NoC 106 according to another example. In the example, the NoC 106 includes vertical portions 402 (VNoC) and horizontal portion 404 (HNoC). The VNoC 402 is disposed between PL regions 102. The HNoC 404 is disposed between the PL regions 102 and the 10 regions 108. The hardened circuits 110 include memory interfaces 406. The PS 104 is coupled to the HNoC 404.

In the example, the PS 104 includes a plurality of NMUs 202 coupled to the HNoC 404. The VNoC 402 includes both NMUs 202 and NSUs 204, which are disposed in the PL regions 102. The memory interfaces 406 include NSUs 204 coupled to the HNoC 404. Both the HNoC 404 and the VNoC 402 include NPSs 206 connected by routing 208. In the VNoC 402, the routing 208 extends vertically. In the HNoC 404, the routing extends horizontally. In each VNoC 402, each NMU 202 is coupled to an NPS 206. Likewise, each NSU 204 is coupled to an NPS 206. NPSs 206 are coupled to each other to form a matrix of switches. Some NPSs 206 in each VNoC 402 are coupled to other NPSs 206 in the HNoC 404.

Although only a single HNoC 404 is shown, in other examples, the NoC 106 can include more than one HNoC 404. In addition, while two VNoCs 402 are shown, the NoC 106 can include more than two VNoCs 402. Although memory interfaces 406 are shown by way of example, it is to be understood that other hardened circuits can be used in place of, or in addition to, the memory interfaces 406.

Figure 5:
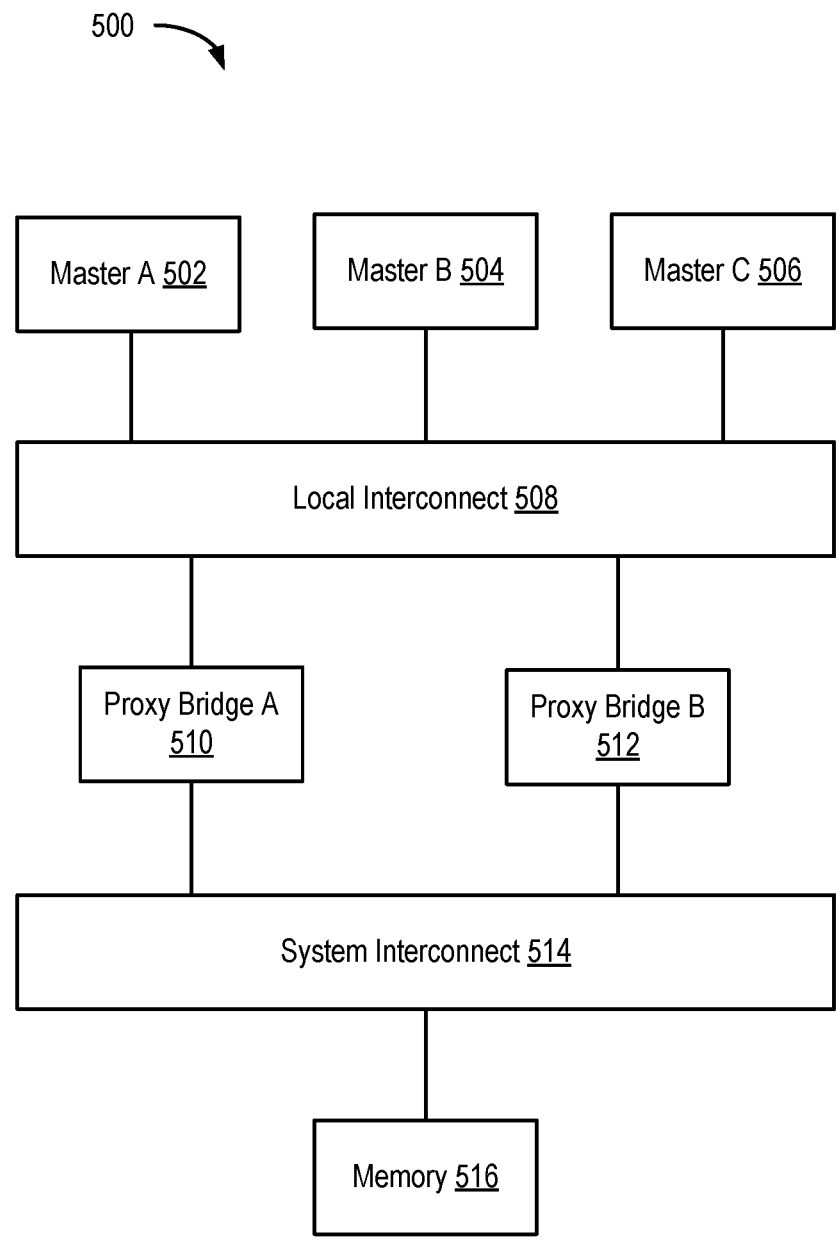
FIG. 5 is a block diagram depicting a multi-master system according to an example.

FIG. 5 is a block diagram depicting a multi-master system 500 according to an example. The multi-master system 500 includes master circuits 502, 504, and 506, local interconnect 508, ECC proxy bridges 510 and 512, system interconnect 514, and memory 516. The master circuits 502-506 are coupled to the local interconnect 508. The local interconnect 508 can be an AXI interconnect or the like. The master circuits 502-506 can be hardened circuits or circuits configured in programmable logic. The local interconnect 508 is coupled to the system interconnect 514 through the ECC proxy bridges 510 and 512. The system interconnect 514 can be the NoC 106 described above. For example, each proxy bridge 510 and 512 can be coupled to an NMU 202 in the system interconnect 514. The system interconnect 514 is coupled to the memory 516. For example, the memory 516 can be coupled to an NSU 204 in the system interconnect 514.

Each ECC proxy bridge 510, 512 is a hardened circuit in the SoC 100 (e.g., not a circuit configured in the PL 102). Implementing ECC proxy bridges 510, 512 as hardened circuits improves latency in the multi-master system 500 and conserves programmable logic to use for other functions.

In the example, the master circuit 502 accesses the memory 516 through the ECC proxy bridge 510. The master circuit 504 and the master circuit 506 access the memory 516 through the ECC proxy bridge 512. Each master circuit 502-506 has the same view of the memory 516. Each ECC proxy bridge 510, 512 provides an ECC proxy that allows a region of the memory 516 to be defined where (1) transactions consume twice the memory space; (2) transactions consume twice as much bandwidth going to the memory 516; but where (3) the address and data of each transaction has ECC protection. While two ECC proxy bridges 510, 512 are shown in the example, in general the multi-master system 500 can include one or more ECC proxy bridges. An ECC proxy provides a single address match region for ECC proxy data. This region is configured during boot time and is configured identically across each ECC proxy bridge 510, 512. For transactions that do not match the defined ECC proxy region, the ECC proxy bridges 510, 512 pass those transactions unaffected without further processing.

Figure 6:
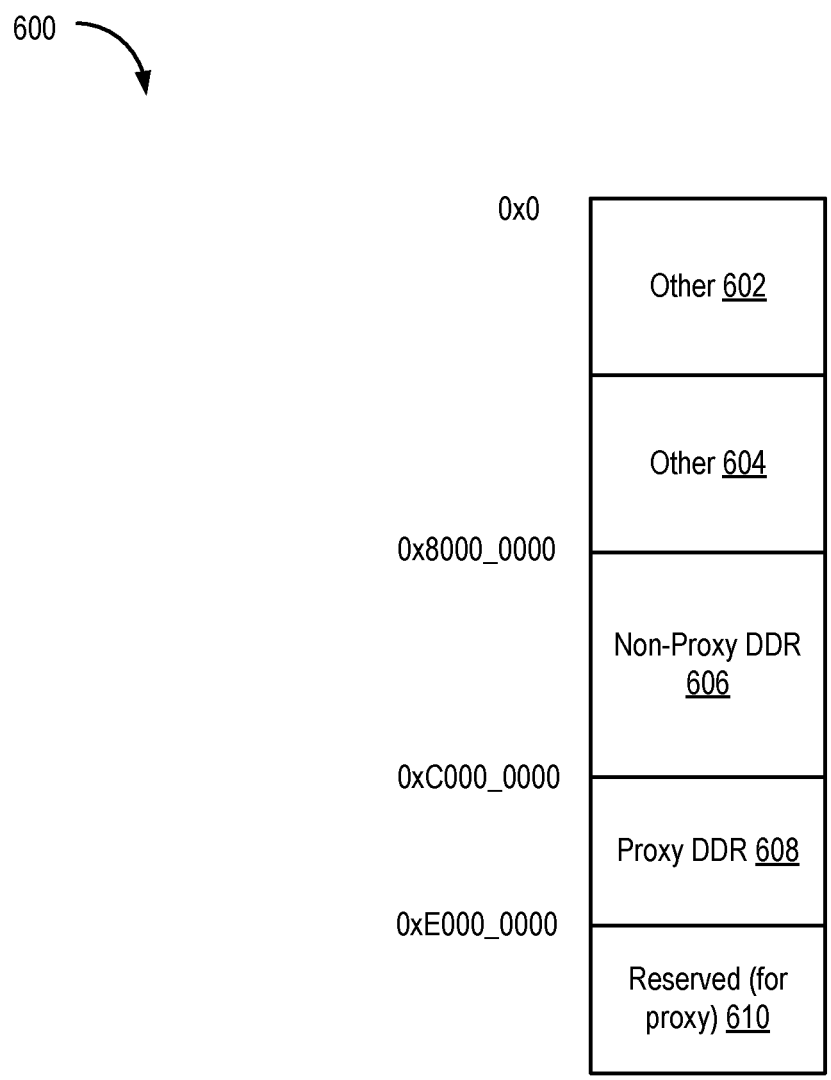
FIG. 6 is a block diagram depicting an example address layout of a memory according to an example.

FIG. 6 is a block diagram depicting an example address layout 600 of the memory 516 according to an example. In the example, lower portions 602 and 604 of the address layout 600 (e.g., below 0x8000_0000) are reserved for various peripherals and circuits. A portion 606 between 0x8000_0000 and 0xC00_0000 is normal memory that is not protected by ECC proxy. A portion 608 between 0xE000_0000 and 0xC000_0000 is an ECC protected proxy region (e.g., 0.5 GB region in the example). Another 0.5 GB region 610 is reserved above the ECC protected proxy region 608, since ECC proxy protection requires twice the memory footprint as normal memory regions (unprotected by ECC proxy). The layout 600 is merely one example and can have different regions, each having different sizes and locations in the layout.

From the point-of-view of the master circuits 502-506, the ECC proxy region appears as a linear contiguous memory region that is 0.5 GB in size (e.g., in the layout 600). At the memory 516, the ECC proxy region requires 1 GB of address space. The ECC proxy bridges 510, 512 handle (1) identifying transactions that target the ECC proxy region and (2) inserting and interleaving ECC bytes into the data. The ECC proxy bridges 510, 512 perform the reverse process on the data that is read back from the ECC proxy region of the memory 516. An example technique for interleaving ECC bytes with data is described below.

Figure 7:
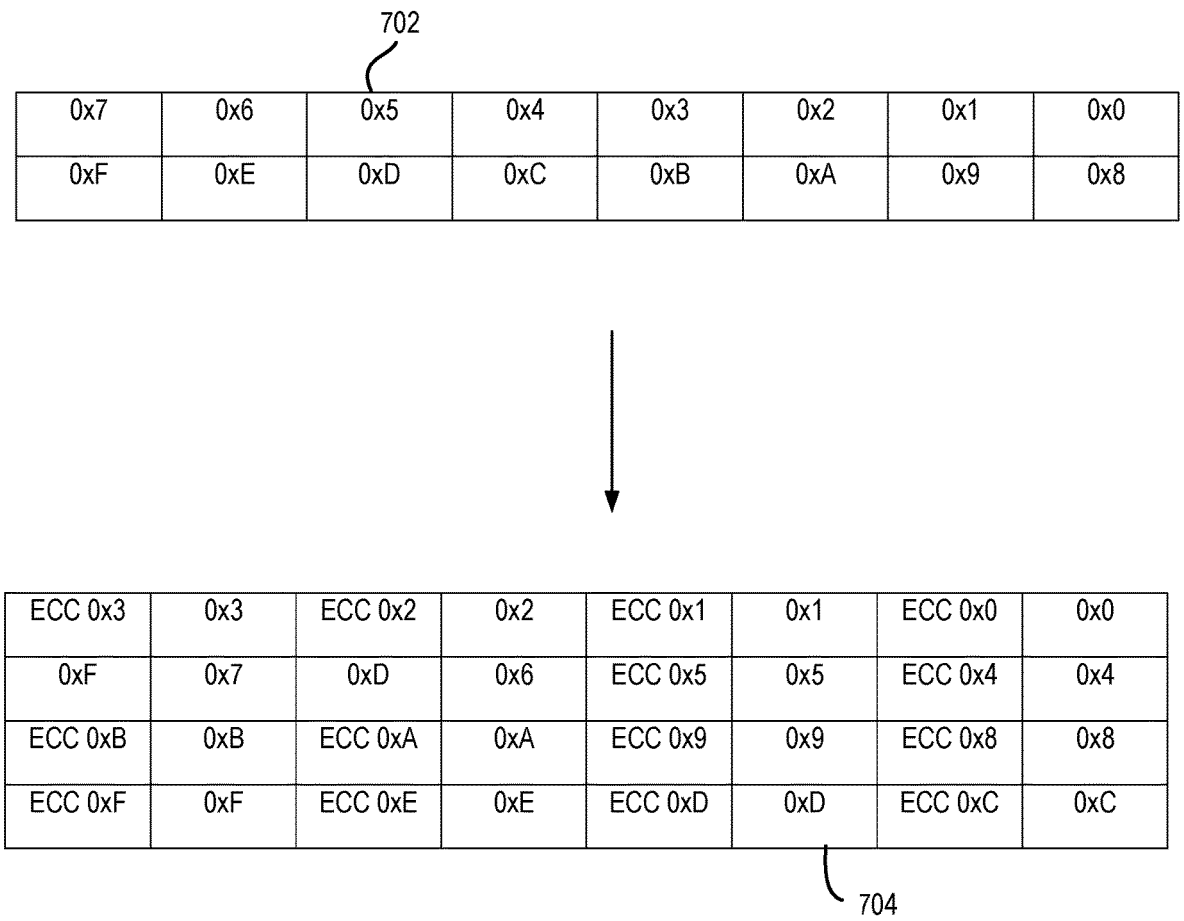
FIG. 7 is a block diagram depicting an example technique for interleaving ECC bytes with data bytes.

FIG. 7 is a block diagram depicting an example technique for interleaving ECC bytes with data bytes. In the example, a transaction 702 includes 16 bytes 0x0 through 0xF. Assume the transaction 702 targets the ECC proxy region in the memory 516. In such case, an ECC proxy bridge 510 or 512 generates the transaction 704. In the transaction 704, each byte of the transaction 702 is followed by an ECC byte corresponding to the byte. For example, the transaction 704 includes the byte 0x0, followed by an ECC byte for 0x0, followed by the byte 0x1, followed by the ECC byte for 0x1, and so on. The transaction 704 concludes with the byte 0xF followed by an ECC byte for 0xF.

Figure 8:
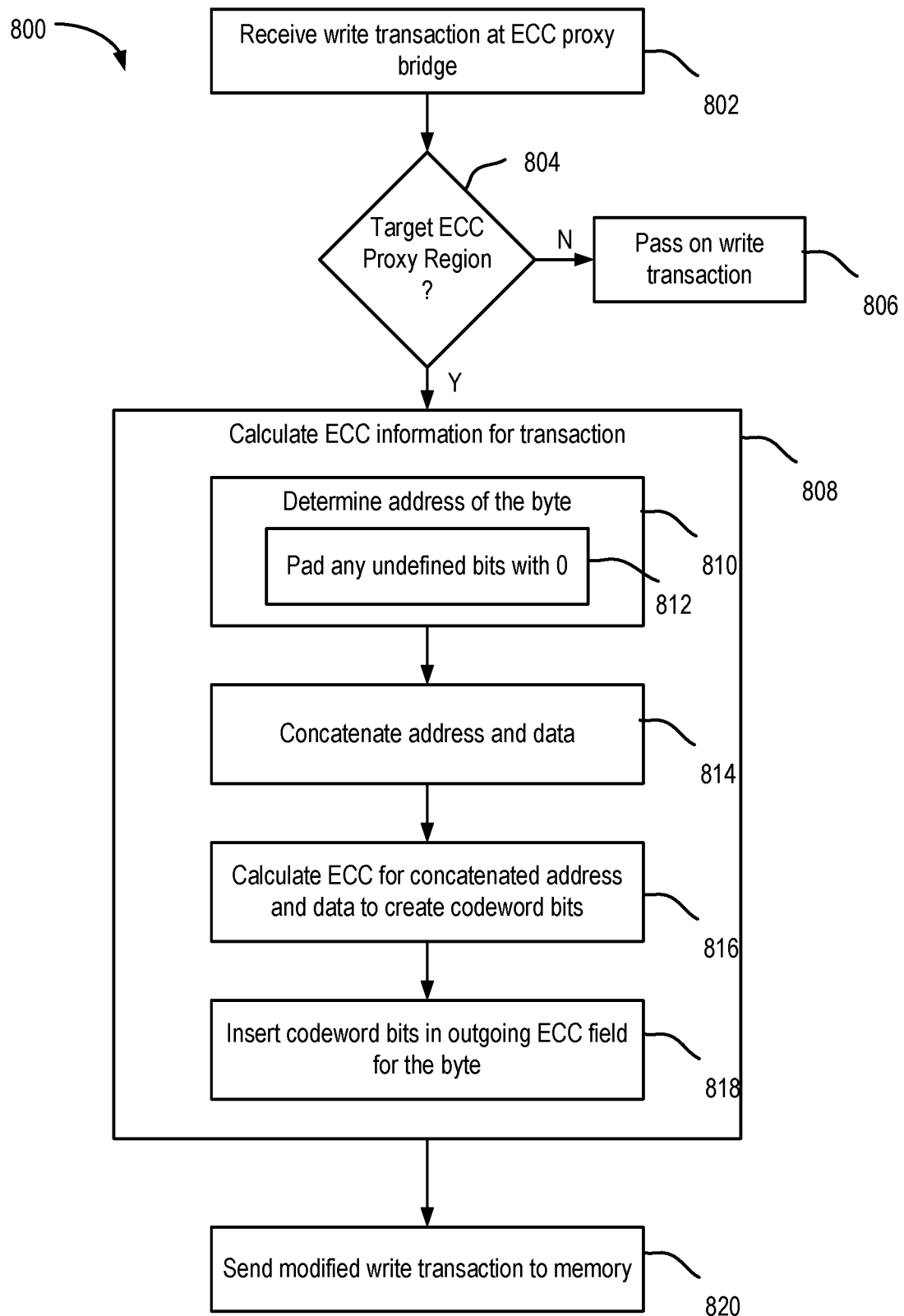
FIG. 8 is a flow diagram depicting a method of processing a write transaction in the multi-master system of FIG. 5 according to an example.

FIG. 8 is a flow diagram depicting a method 800 of processing a write transaction in the multi-master system 500 of FIG. 5 according to an example. The method 800 begins at step 802, where an ECC proxy bridge 510 or 512 receives a write transaction from a master circuit 502, 504, or 506. At step 804, the ECC proxy bridge 510 or 512 determines if the write transaction targets an ECC proxy region in the memory 516. If not, the method 800 proceeds to step 806, where the ECC proxy bridge 510 or 512 passes the write transaction onto the memory 516 without further processing. If the write transaction targets an ECC proxy region, the method 800 proceeds to step 808, where the ECC proxy bridge 510 or 512 calculates ECC information for the write transaction.

The ECC proxy bridge 510 or 512 can calculate the ECC information beginning at step 810, where the ECC proxy bridge 510 or 512 determines an address of a byte. At step 812, the ECC proxy bridge 510 or 512 pads any undefined bits of the address with zero. At step 814, the ECC proxy bridge 510 or 512 concatenates the address of the byte and the data of the byte. At step 816, the ECC proxy bridge 510 or 512 calculates ECC for the concatenated address and data to create codeword bits. At step 818, the ECC proxy bridge 510 or 512 inserts the codeword bits in an outgoing ECC field for the byte. The ECC proxy bridge 510 or 512 performs steps 810 through 818 for each byte in the write transaction. At step 820, the ECC proxy bridge 510 or 512 sends the modified write transaction to the memory 516.

Figure 9:
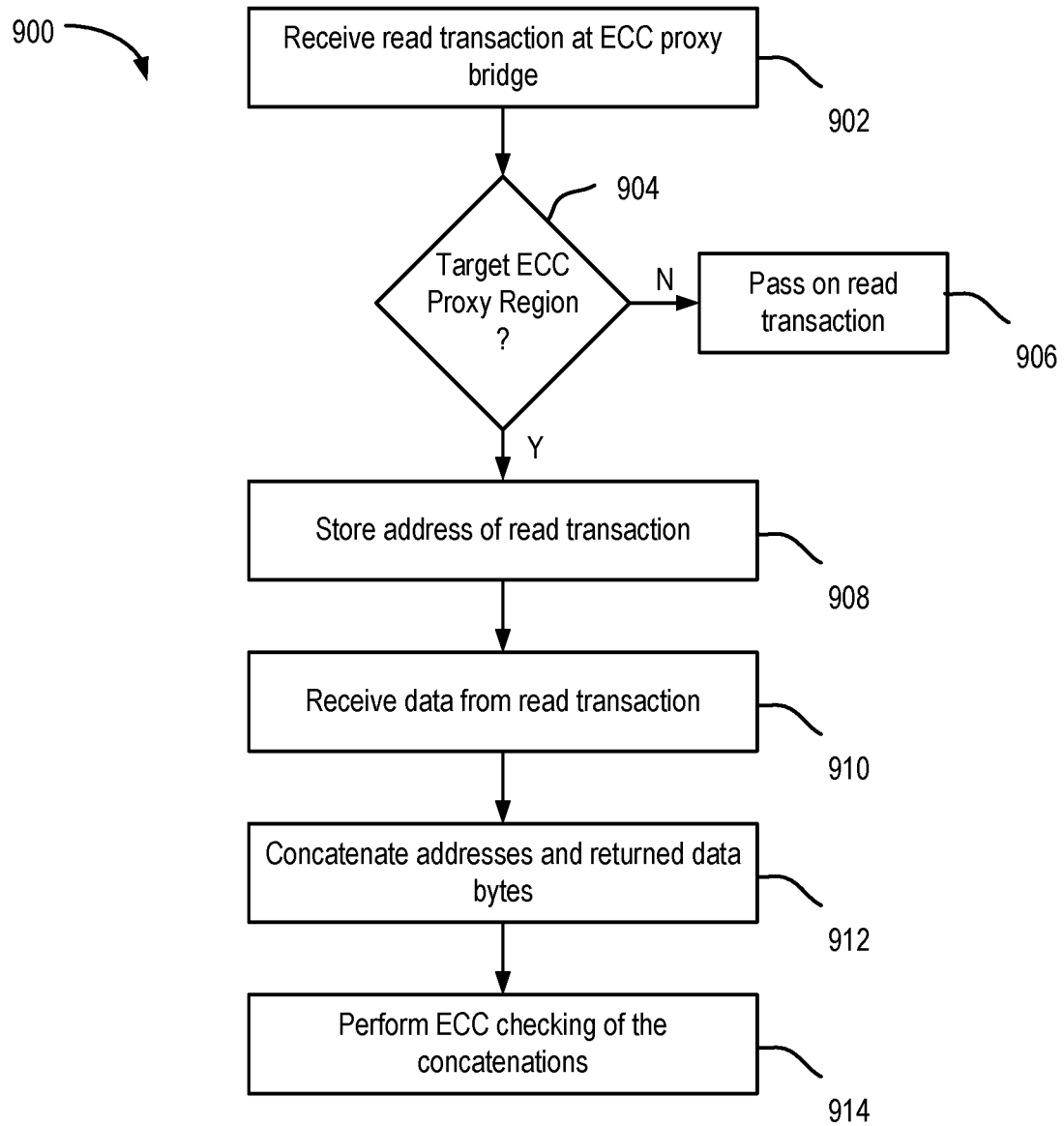
FIG. 9 is a flow diagram depicting a method of processing a read transaction in the multi-master system of FIG. 5 according to an example.

FIG. 9 is a flow diagram depicting a method 900 of processing a read transaction in the multi-master system 500 of FIG. 5 according to an example. The method 900 begins at step 902, where an ECC proxy bridge 510 or 512 receives a read transaction from a master circuit 502, 504, or 506. At step 904, the ECC proxy bridge 510 or 512 determines if the read transaction targets an ECC proxy region in the memory 516. If not, the method 900 proceeds to step 906, where the ECC proxy bridge 510 or 512 passes the read transaction onto the memory 516 without further processing. If the read transaction targets an ECC proxy region, the method 900 proceeds to step 908.

At step 908, the ECC proxy bridge 510 or 512 stores the address of the read transaction. At step 910, the ECC proxy bridge 510 or 512 receives the data from the memory 516 for the read transaction. At step 912, the ECC proxy bridge 510 or 512 concatenates the stored address and the returned data. At step 914, the ECC proxy bridge 510 or 512 performs ECC checking of the concatenated address and data.

Figure 10:
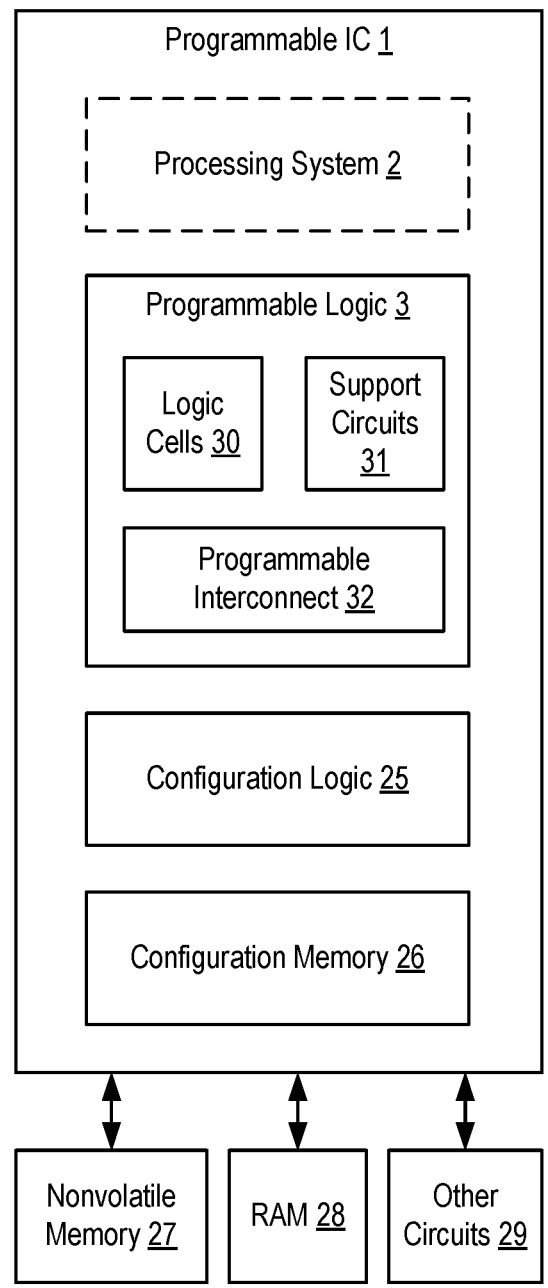
FIG. 10 is a block diagram depicting a programmable integrated circuit in which the NoC described herein can be employed according to an example.

FIG. 10 is a block diagram depicting a programmable IC 1 according to an example in which the NoC 106 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, 10 circuits, and the like.

Figure 11:
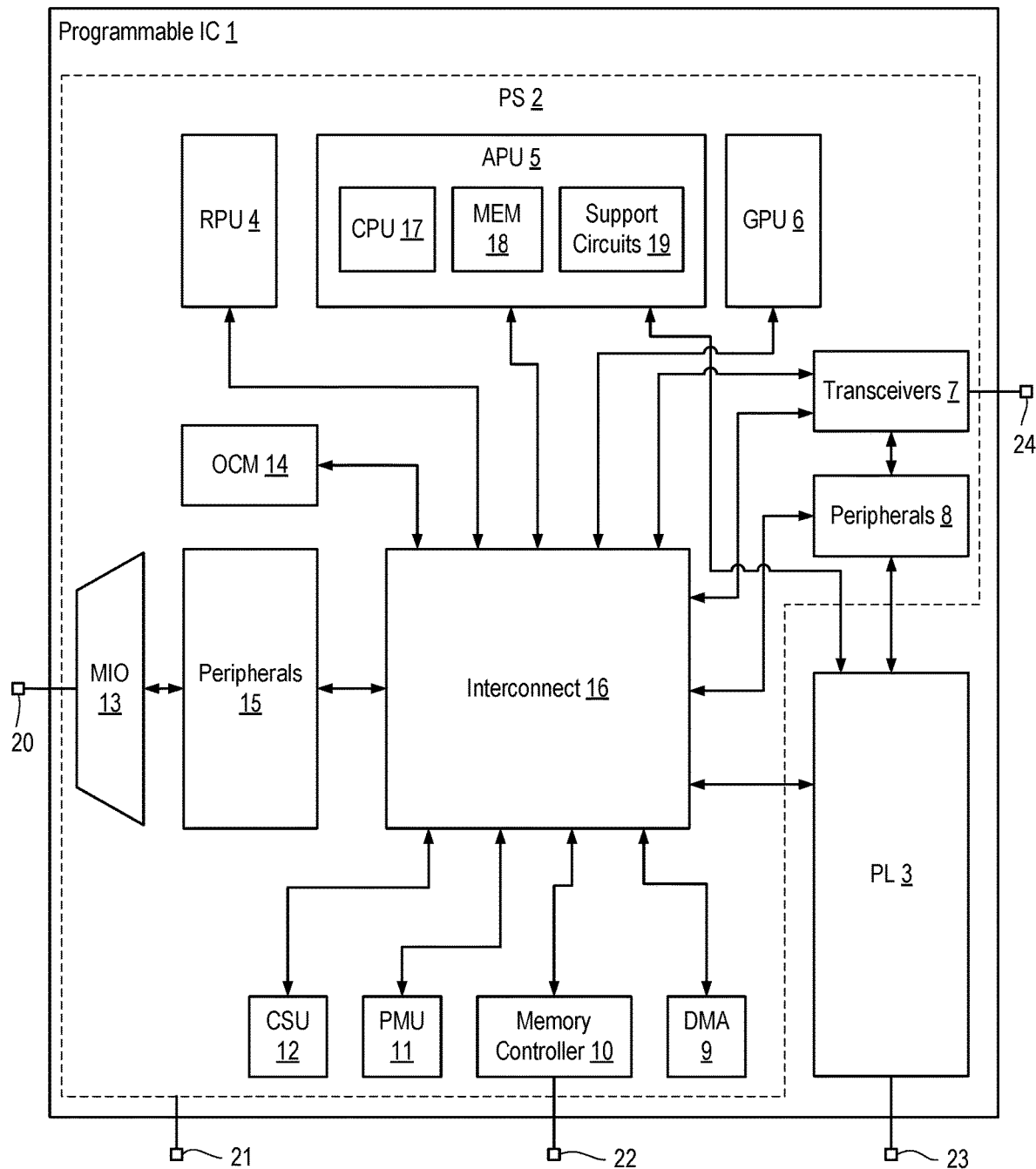
FIG. 11 is a block diagram depicting a System-on-Chip (SoC) implementation of the programmable IC of FIG. 11 according to an example.

FIG. 11 is a block diagram depicting a System-on-Chip (SoC) implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed 10 (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19. The APU 5 can include other circuitry, including L1 and L2 caches and the like. The RPU 4 can include additional circuitry, such as L1 caches and the like. The interconnect 16 can include cache-coherent interconnect or the like.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 132 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose 10 (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, MGTs, and the like.

Figure 12:
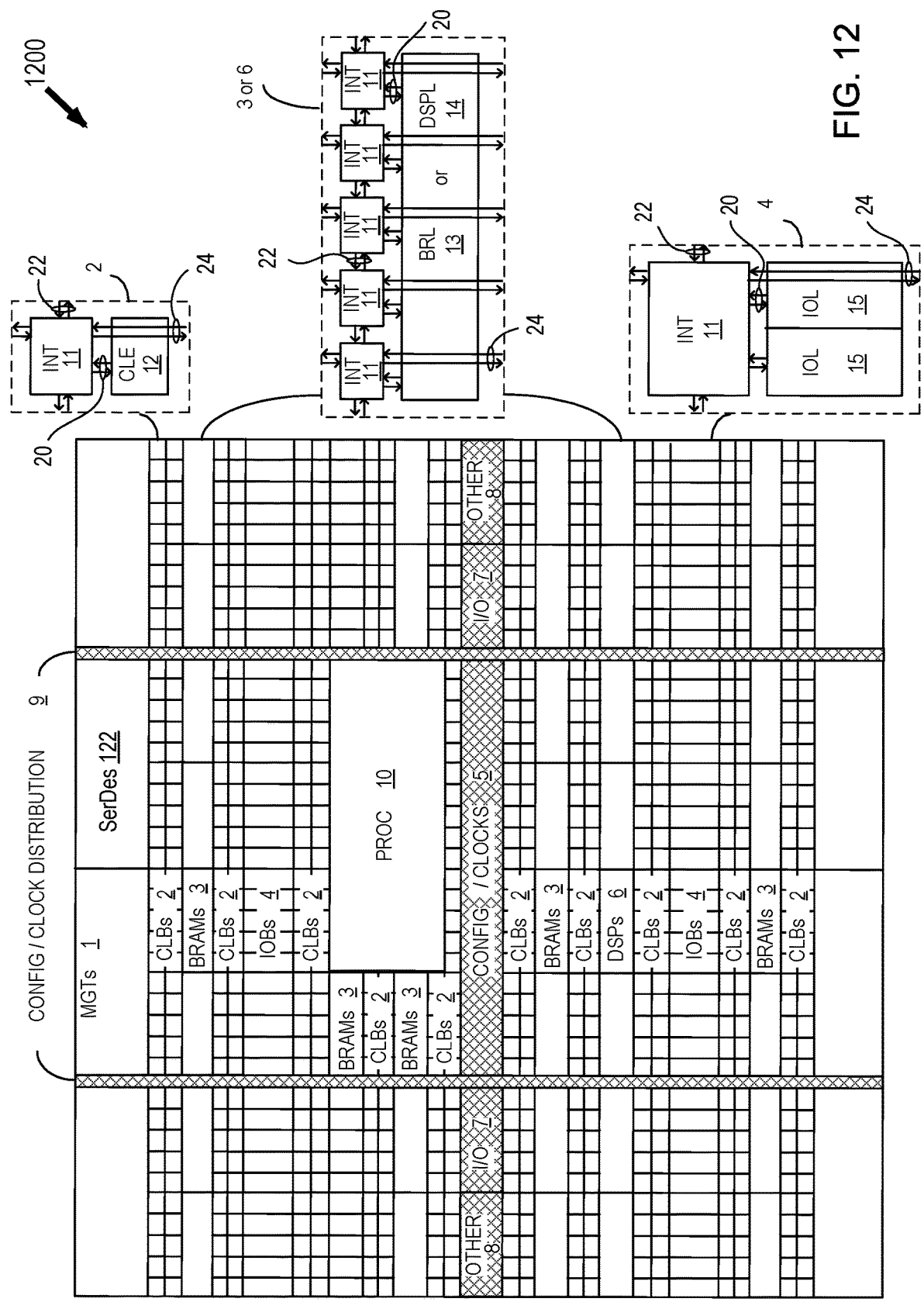
FIG. 12 illustrates a field programmable gate array (FPGA) implementation of the programmable IC of FIG. 11 according to an example.

FIG. 12 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 12. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 13) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 12 include additional logic blocks that disrupt the regular columnar structure making up a large part of the FPGA. The additional logic blocks can be programmable blocks and/or dedicated logic.

Note that FIG. 12 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 12 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A multi-master system in a system-on-chip (SoC), comprising:
   a plurality of master circuits;
   an error-correcting code (ECC) proxy bridge comprising hardened circuitry in the SoC;
   a local interconnect configured to couple the plurality of master circuits to the ECC proxy bridge;
   a memory not having ECC support; and
   a system interconnect configured to couple the ECC proxy bridge to the memory;
   wherein the ECC proxy bridge is configured to:
      establish an ECC proxy region in the memory; and
      for each write transaction from the plurality of master circuits that targets the ECC proxy region:
         pad an undefined bit of an address of a byte of the respective write transaction; and
         calculate and insert ECC bytes into the respective write transaction by interleaving the ECC bytes between bytes of the respective write transaction.

2. The multi-master system of claim 1, wherein the ECC proxy bridge is configured to calculate ECC bytes for each byte of each write transaction targeting the ECC proxy region by: determining the address of the respective byte, concatenating the address and data of the respective byte, and calculating an ECC byte for the concatenation.

3. The multi-master system of claim 1, wherein the ECC proxy bridge is configured to pass on to the memory each write transaction from the plurality of master circuits that does not target the ECC proxy region.

4. The multi-master system of claim 1, wherein the ECC proxy bridge is further configured to, for each read transaction from the plurality of master circuits that targets the ECC proxy region, perform ECC checking of the respective read transaction.

5. The multi-master system of claim 4, wherein the ECC proxy bridge is configured to perform ECC checking for each read transaction targeting the ECC proxy region by: storing address information of the respective read transaction, concatenating addresses and data of bytes, and performing ECC checking of the concatenations.

6. The multi-master system of claim 4, wherein the ECC proxy bridge is configured to pass on to the memory each read transaction from the plurality of master circuits that does not target the ECC proxy region.

7. A programmable integrated circuit (IC), comprising:
   a processing system;
   programmable logic;
   a plurality of master circuits disposed in the processing system, the programmable logic, or both the processing system and the programmable logic;
   an error-correcting code (ECC) proxy bridge comprising hardened circuitry in the programmable IC;
   a local interconnect configured to couple the plurality of master circuits to the ECC proxy bridge;
   a memory controller configured to interface with a memory that does not have ECC support; and
   a system interconnect configured to couple the ECC proxy bridge to the memory controller;
   wherein the ECC proxy bridge is configured to:
      establish an ECC proxy region in the memory; and
      for each write transaction from the plurality of master circuits that targets the ECC proxy region:
         pad an undefined bit of an address of a byte of the respective write transaction; and
         calculate and insert ECC bytes into the respective write transaction by interleaving the ECC bytes between bytes of the respective write transaction.

8. The programmable IC of claim 7, wherein the ECC proxy bridge is configured to calculate ECC bytes for each byte of each write transaction targeting the ECC proxy region by: determining the address of the respective byte, concatenating the address and data of the respective byte, and calculating an ECC byte for the concatenation.

9. The programmable IC of claim 7, wherein the ECC proxy bridge is configured to pass on to the memory each write transaction from the plurality of master circuits that does not target the ECC proxy region.

10. The programmable IC of claim 7, wherein the ECC proxy bridge is further configured to, for each read transaction from the plurality of master circuits that targets the ECC proxy region, perform ECC checking of the respective read transaction.

11. The programmable IC of claim 10, wherein the ECC proxy bridge is configured to perform ECC checking for each read transaction targeting the ECC proxy region by: storing address information of the respective read transaction, concatenating addresses and data of bytes, and performing ECC checking of the concatenations.

12. The programmable IC of claim 10, wherein the ECC proxy bridge is configured to pass on to the memory each read transaction from the plurality of master circuits that does not target the ECC proxy region.

13. A method of communication between a plurality of master circuits and a memory in a system-on-chip (SoC), comprising:
   establishing, by an error-correcting code (ECC) proxy bridge comprising hardened circuitry in the SoC, an ECC proxy region in a memory;
   receiving write transactions from a plurality of master circuits for the memory, the write transactions targeting the ECC proxy region in the memory;
   padding an undefined bit of an address of a byte of a respective one or more of the write transactions at the ECC proxy bridge;
   calculating, for each write transaction of the write transactions, ECC bytes for bytes of the respective write transaction at the ECC proxy bridge;

inserting, by the ECC proxy bridge, the ECC bytes into the respective write transactions by interleaving the ECC bytes between bytes of the respective write transaction; and forwarding the write transactions from the ECC proxy bridge to the memory.

14. The method of claim 13, wherein the step of calculating comprises, for each byte of each write transaction:
determining the address of the respective byte;
concatenating the address and data of the respective byte; and
calculating an ECC byte for the concatenation.

15. The method of claim 13, further comprising:
receiving additional write transactions from the plurality of master circuits that do not target the ECC proxy region; and
passing the additional write transactions from the ECC proxy bridge to the memory.

16. The method of claim 13, further comprising:
receiving read transactions from the plurality of master circuits at the ECC proxy bridge, the read transactions targeting the ECC proxy region; and
performing, at the ECC proxy bridge, ECC checking in response to each read transaction.

17. The method of claim 16, wherein the step of performing the ECC checking comprises, for each read transaction:
storing address information of the respective read transaction;
concatenating addresses and data of bytes; and
performing ECC checking of the concatenations.

18. The method of claim 13, further comprising:
receiving additional read transactions from the plurality of master circuits that do not target the ECC proxy region; and
passing the additional read transactions from the ECC proxy bridge to the memory.

* * * * *